United States Patent [19]
Ruelke et al.

[11] Patent Number: 5,303,409
[45] Date of Patent: Apr. 12, 1994

[54] AUTOMATICALLY COMPENSATED SQUELCH CIRCUIT

[75] Inventors: Charles R. Ruelke, Davie; Alexander Rodriguez, Hialeah, both of Fla.

[73] Assignee: Motorola, Inc., Schaumburg, Ill.

[21] Appl. No.: 894,132

[22] Filed: Jun. 4, 1992

[51] Int. Cl.$^5$ .............................................. H04B 1/10
[52] U.S. Cl. ..................... 455/219; 455/220; 375/104
[58] Field of Search ............... 455/35.1, 36.1, 37.1, 455/212, 213, 218, 219, 220, 221, 222, 223, 224, 225, 200.1; 375/104; 381/123; 307/308, 310

[56] References Cited

U.S. PATENT DOCUMENTS

| | | | |
|---|---|---|---|
| 3,851,253 | 11/1974 | Eastmond | 455/212 |
| 4,267,598 | 5/1981 | Palmer | 455/219 |
| 4,411,021 | 10/1983 | Yoakum | 455/222 |
| 4,731,873 | 3/1988 | Voyce | 455/218 |
| 4,967,165 | 10/1990 | Lee et al. | |
| 5,041,799 | 8/1991 | Pirez | |
| 5,063,597 | 10/1991 | Seo et al. | 455/222 |

Primary Examiner—Reinhard J. Eisenzopf
Assistant Examiner—Doris To
Attorney, Agent, or Firm—Pedro P. Hernandez

[57] ABSTRACT

A receiver (100) includes an audio section (200) which provides for compensated squelch settings which are automatically adjustable for changes in operating conditions such as changes in temperature or receiver channel spacing. Temperature circuit (128) provides a temperature signal (134) and controller (122) provides a signal indicating the channel spacing being used by receiver (100). The two signals are combined and formed into an address word which is in turn used to look-up a compensation word from memory location (218). The compensation word is then combined to a default squelch word by adder (216) providing for a compensated squelch word. The compensated squelch word automatically adjusts the squelch circuit's threshold level in order to compensate for changes in operational conditions affecting the squelch circuit.

17 Claims, 5 Drawing Sheets

AUTOMATICALLY COMPENSATED SQUELCH CIRCUIT

TECHNICAL FIELD

This invention relates generally to receiver squelch circuits, and more specifically to an automatically compensated receiver squelch circuit.

BACKGROUND

Changes in temperature and in the operating bandwidth of a radio frequency receiver affect the operation of the receiver's squelch circuit. For example, when a two-way radio is operating at temperature extremes, the receiver's squelch circuit is prone to a phenomena known in the art as "squelch popping." Squelch popping is where the receiver's squelch opens and closes, in a very short period of time, even when no signal meeting the squelch circuit's threshold criteria is present. This phenomena causes a sound resembling a popping sound to be generated at the radio's speaker. The speaker popping sounds cause annoyance to radio users. The usual solution to this annoying unsquelching problem is for the radio user to increase the squelch circuits threshold level either manually, if the radio has a squelch adjustment control, or by reprogramming the radio's squelch threshold level(s) if the radio does not have a manual squelch control.

The reason that the squelch circuit unsquelches is that the squelch setting although set at a point which would provide good receiver operation during normal operating conditions, the setting is affected by extreme operating temperature changes due to the fact that temperature affects the squelch circuit components. The change in receiver operating temperature to a higher or lower operating temperature extreme, has the affect of prematurely unsquelching the circuit, or causing the squelch circuit to require a higher level input signal in order to unsquelch the circuit. The affect on the squelch circuit will depend on the temperature characteristics of the circuit.

The problem with increasing the radio's squelch threshold level (the signal input level required to unsquelch the radio) in order to avoid premature unsquelching is that it causes the radio to have reduced communication range. The decrease in communication range is due to the fact that a larger received signal level must be present at the receiver's front-end in order for the radio to unsquelch.

Since receivers used in two-way radios are usually operated over varying ambient temperature conditions, a radio user will usually be forced into having to set a "higher" (a point which would require a higher received signal to unsquelch the receiver squelch circuit) squelch setting in situations (e.g., normal operating temperatures) where the radio user could have had a lower squelch setting which would have allowed for greater operating range. This would be the case where the user has to spend a portion of his operating time in extreme temperature conditions, where squelch popping occurs and the radio user is forced to increase the radio's squelch threshold level. Typically, a radio user will tend to forget to readjust the radio's squelch control level once the user moves back into more normal operating conditions. This is especially true for radios which do not provide for manual squelch adjustment by the radio user (e.g., sophisticated radios which program squelch threshold level settings into the radio). The end result being that the radio user has a squelch threshold setting which may be too high for normal use causing otherwise good messages to go unheard.

The same unsquelching problems occurs when a radio begins receiving information signals having different channel spacings that the signals previously received. For example, in modern radios where it is common to have one or more channels in a receiver receiving information having a certain channel spacing and another set of channels receiving information having a second channel spacing specification. A specific example of this would be a 800 Megahertz band radio which could have a set of radio channels in the 821–824 MHz range using 12.5 KHz channel spacing, while having another set of radio channels operating in the 850–870 MHz range using 25 KHz channel spacing. The change in channel spacing causes a change in the characteristic noise footprint of the receiver, which is caused by the changes in deviation due to the channel spacing differences. This again causes the radio's squelch circuit to unsquelch at different threshold levels.

A need thus exists for a receiver squelch circuit which can automatically compensate for the affects caused by changes in temperature or changes in operating bandwidth. The squelch circuit should also provide for maximum receiver operating range, while at the same time being able to avoid squelch popping or premature receiver unsquelching.

SUMMARY OF THE INVENTION

Briefly, according to the invention a receiver squelch circuit, comprises an input means for receiving a temperature signal and a second input means for receiving a channel spacing signal. The squelch circuit further includes a means for converting the temperature signal and channel spacing signal into an address word and a memory means responsive to the address word for providing a compensation word. A compensation means then receives the compensation word and automatically compensates the receiver squelch circuit.

DETAILED DESCRIPTION OF THE PREFERRED EMBODIMENT

Figure 1:
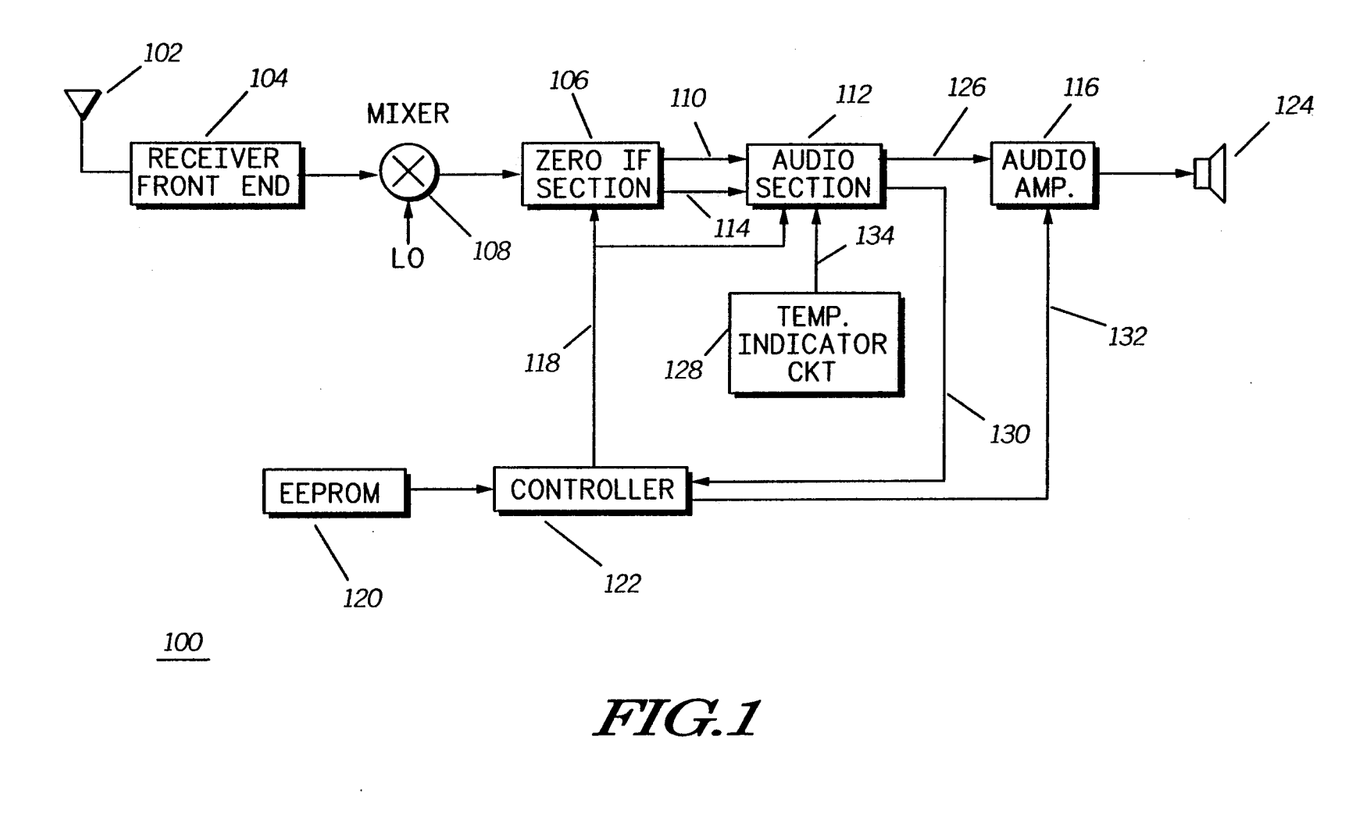
FIG. 1 is a simplified block diagram of a radio receiver in accordance with the present invention.

Referring now to the drawings and specifically to FIG. 1, there is shown a radio frequency receiver 100 utilizing a compensated audio squelch section 112 in accordance with the present invention. Receiver 100 includes an antenna 102 for receiving radio frequency signals and a conventional receiver front end 104 for further processing of the received signal. The receiver front end 104 includes the receiver preselector, R.F. pre-amplifier, and other sections which are normally found in a modern receiver front end section. The processed signal is then sent to a mixer 108 where the processed signal is mixed with a locally generated (LO) signal which is coupled to the second input of mixer 108. Mixer 108 then mixes the two signals together in order to get a resulting intermediate frequency (IF) signal. The resulting IF signal is sent through filter sections (not shown) where the signal is further filtered according to the particular receiver's design specifications. The filtered IF signal is then inputted into a conventional zero intermediate frequency (ZIF) section 106. ZIF section 106 provides a base band audio output signal 110 and a squelch control signal 114 both of which are coupled to an audio signal filtering section (ASFIC) 112 which is automatically compensated for in accordance with the present invention.

Receiver 100 further includes a control means, such as a microprocessor or microcontroller 122. Microprocessor 122 controls the overall operation of receiver 100 via data bus 118. Coupled to microprocessor 122 is associated memory block 120 which can take the form of an electrically-erasable programmable read-only memory (EEPROM) which stores the receiver's operating parameters, such as the receiver's channel frequency information, receiver tuning information values, the particular channel spacing used in particular receiver channels, etc. Audio section 112 takes the base band audio input signal 110 and further filters and amplifies the audio signal producing an output audio signal 126 which is further amplified by audio amplifier 116 for presentation to speaker 124.

Coupled to audio section 112 is a conventional temperature sensing circuit 128 as known in the art, which can provide an output signal 134, which is representative of the operating temperature of audio section 112. This information is utilized by audio circuit 112 for compensating the audio section's squelch settings over temperature. Adjustment of the squelch setting can include adjustment of the squelch threshold level, adjustment of the amount of gain (or attenuation) in the squelch path, or anything which would cause the squelch circuit to unsquelch at a different input signal level. Audio section 112 receives the squelch signal 114 and further processes the signal to produce a squelch detect signal 130 which is fed to controller 122.

Squelch detect signal 130 informs controller 122 when to allow audio to flow from audio section 112 to speaker 124. Controller 122, upon receiving the squelch detect signal 130 determines whether to send a control signal 132 to audio amplifier 116 in order to allow the audio signal 126 to reach speaker 124. Preferably, the squelch detect signal 130 can take the form of a "5" volt or high signal informing controller 122 to unsquelch, while a low signal or "0" volts informing the controller to maintain the receiver squelched (no audio going to speaker 124).

Figure 2:
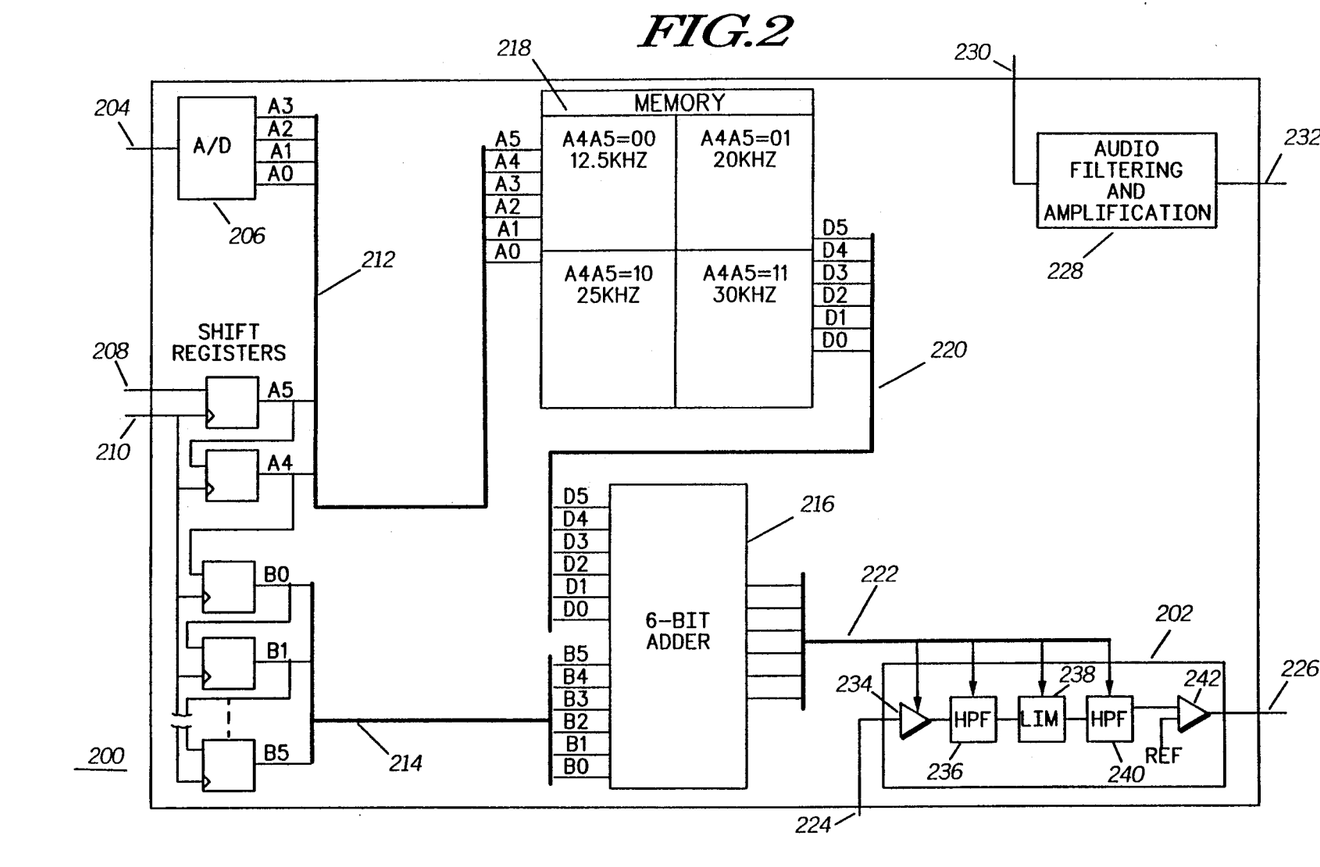
FIG. 2 is a block diagram of a squelch circuit utilizing the compensation scheme in accordance with the present invention.

In FIG. 2, a more detailed block diagram of an audio section 200 similar to section 112, in FIG. 1, is shown. Audio circuit 200 comprises an input means 204 for receiving a temperature signal representative of the temperature of operation for audio circuit 200. In the preferred embodiment, the circuit providing the temperature signal (circuit 128 in FIG. 1) is a conventional temperature sensing circuit which provides an analog signal which varies in voltage level depending on the operating temperature of audio circuit 200. Preferably, temperature circuit 128 is located in close proximity to audio section 200 in order to provide close temperature approximations of the operating temperature of circuit 200. Once the temperature signal is received by audio circuit 200, a conversion means such as an analog-to-digital converter 206 converts the analog signal into a four-bit (A0-A3) digital representation of the analog signal.

Audio circuit 200, also includes a second input means 208 for receiving a serial data message. The serial data message contains a pair of bits (A5 and A4) representative of the channel spacing presently being used by the receiver, and 6 bits (B0-B5) which are representative of the standard squelch setting values (default squelch value for the receiver). These standard squelch setting values or nominal values are generated when a radio is tuned during manufacturing and the values are then stored in EEPROM 120. These nominal values control digitally variable circuits which comprise squelch circuit 200.

The serial data message sent to input 208 is provided by controller 122, shown in FIG. 1. The serial data message is clocked into appropriate shift registers (A4-A5 and B0-B5) by a clock signal provided by receiver 100 into clock input 210. The clock signal into clock input 210 can be the clock signal from controller 122 or from another clock source found in receiver 100. Although the present invention utilizes a serial bus 208 as part of the second input means, a parallel bus or other type of data transferring scheme could be utilized just as well.

The temperature and channel spacing information provided by controller 122 to audio section 200 via input means 208 provides for a 6-bit address word to be generated, which is used to address the appropriate compensation information from a memory means, such as memory section 218. It should be noted that the term "word" as used in this specification does not necessarily refer to an 8 bit data set as referred to in the computer art, but can signify a set of bits not equal to 8 bits in length such as the 6-bit address word. Memory section 218 can either be an EEPROM or a read-only memory (ROM). The 6-bit address word generated by inputs 204 and 208 provide for an address word which is transmitted via address bus 212, in order to select appropriate squelch circuit compensation information from memory 218.

An example will help explain the process in more detail. If receiver 100 is operating in a receiver channel which has a channel spacing of 25 KHz, controller 122 would generate bit A4 to equal a "1" and bit A5 to equal a "0." The same process is also performed with the temperature information. Assuming temperature measuring circuit 128, in FIG. 1, measures the temperature of circuit 200 to be 30 degrees Celsius. Circuit 128 would then provide a voltage level representative of 30 degrees Celsius into input means 204. Analog-to-digital converter 206 takes the temperature representative voltage level and converts it into a representative 4-bit word (bits A0-A3 which are the 4 least-significant bits of the 6 bit word A0-A5). In the preferred embodiment, the compensation information stored in memory device 218 is arranged in blocks having different channel spacings. For example, if bits A4 and A5 are both equal to zero, the compensation information in that memory block is for channels having a channel spacing of 12.5 KHz, if bits A4 and A5 are both equal to one, the compensation information is for a channel having a channel spacing of 30 KHz, etc.

Once the 6-bit address word is generated, it addresses the corresponding memory location in memory 218.

Note that the read enable lines and other related addressing lines which are typically found coupled to a memory device are not shown in FIG. 2, in order to simplify the block diagram. Memory location 218 contains predetermined compensation values for a range of temperatures and channel spacings. The compensation information stored in memory 218 can be generated by statistically analyzing the affects of temperature and channel spacing on a large sample of audio sections 200, and then preprogramming the compensation information necessary to compensate for the variations in operational conditions into memory 218. The compensation information can also be custom tailored to a specific receiver performance by performing individual temperature characterizations on a specific receiver.

The compensation value stored in each of the memory locations in the preferred embodiment is a 6-bit word (bits D0–D5), which is sent to a 6-bit adder Adder circuit 216 adds the 6-bit compensation word, with standard or default squelch word previously sent from serial 208 from controller 122.

The default word sent via bus 214 to adder 216 is the default word or nominal values used to tune the digital pots found in gain stage 234 and high-pass filters 236 and Typically, the default words are generated when the receiver tuned during manufacturing, with the default values being in EEPROM 120 (shown in FIG. 1).

A modifying means such as adder circuit 216 combines the two 6-bit words (compensation word and default word) by the two digital words together, and outputs a 6-bit squelch word. The compensated squelch word is sent via bus 222 to squelch section 202 for adjustment of certain stages of squelch section 202. Those skilled in the art will appreciate the modifying means can take the form of any type of circuit can combine the compensation and default words together. Instead of an adder circuit 216, the modifying means can take form of a microprocessor controlled circuit which performs a predefined algorithm on the two words, for example, subtracts one word from the other, multiplies the two words, etc.

Squelch section 202 comprises an input port 224 for receiving a squelch signal from ZIF section 106 (shown in FIG. The squelch signal is then amplified by a programmable (adjustable) amplifier stage 234, and filtered by an filter stage such as high pass filter 236. The filtered signal processed by limiter circuit 238 and further filtered by a high pass filter 240. The signal is then sent to a comparator which provides a "0" volt or "5" control signal to output port 226, which is coupled to shown in FIG. controller 122. The comparator's output signal is then used controller 122 in making the decision of whether audio 116 will allow for the audio to be presented at speaker 124 (unsquelch condition) as previously discussed.

Audio section 200 further includes an audio amplification section 228 which takes the baseband audio 230 (similar to line 110 in FIG. 1) and amplifies and filters presents the processed audio signal via output 232 (similar to 126 in FIG. 1) to audio amplifier 116 shown in FIG. 1.

In squelch section 202, amplifier 234, high pass filters and 240 are digitally adjustable and include digital control circuits, such as digital potentiometers, which can be the compensated squelch word generated by adder 216. Amplifier 234 and high pass filters 236 and 240 perform a compensation means by receiving the compensated squelch word and compensating the squelch circuit path according to information provided by the squelch word. When in field use, temperature variation that causes a new address word to be generated, will initiate a compensation sequence independent controller 122.

Figure 3:
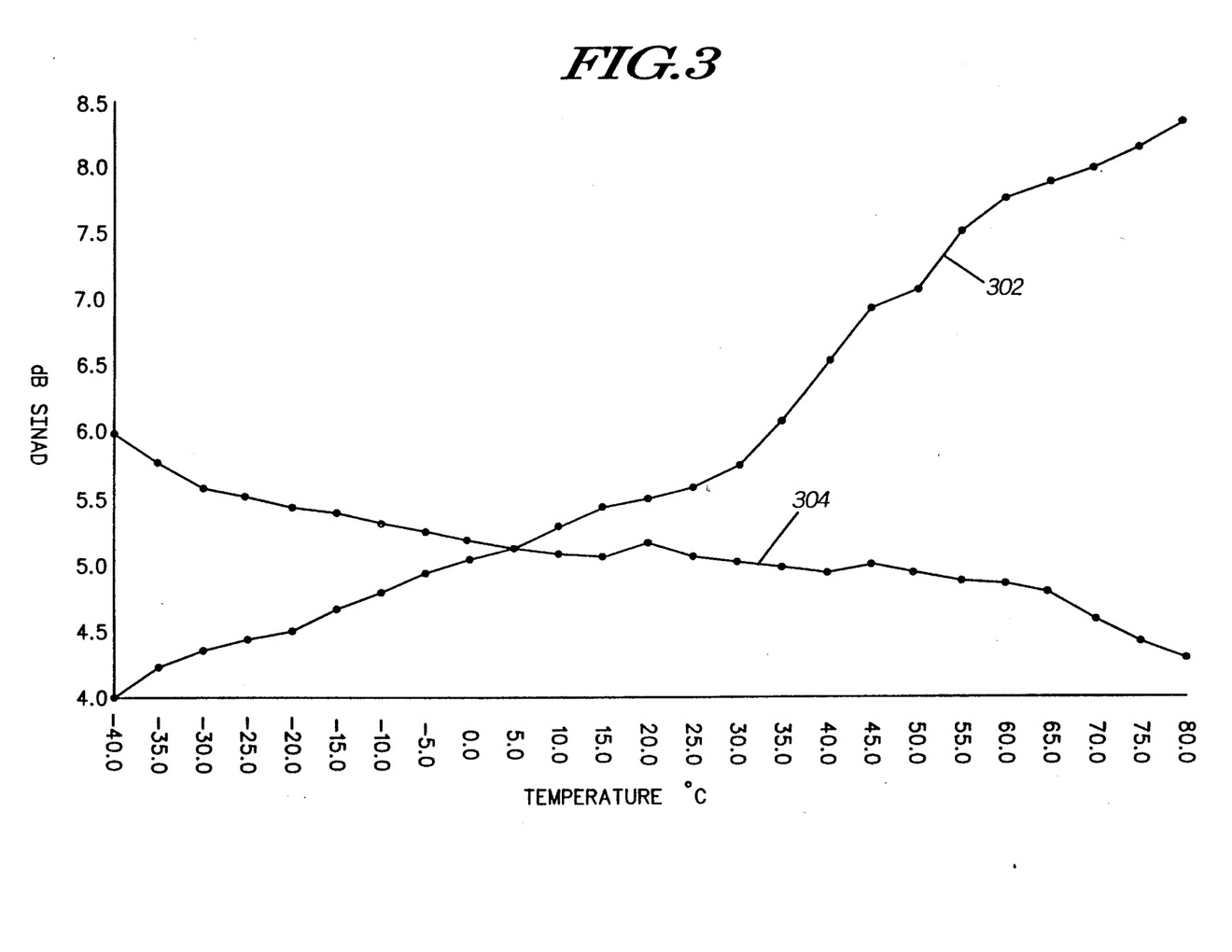
FIG. 3 is a graph plotting SINAD over temperature for two different channel spacing.
Figure 4:
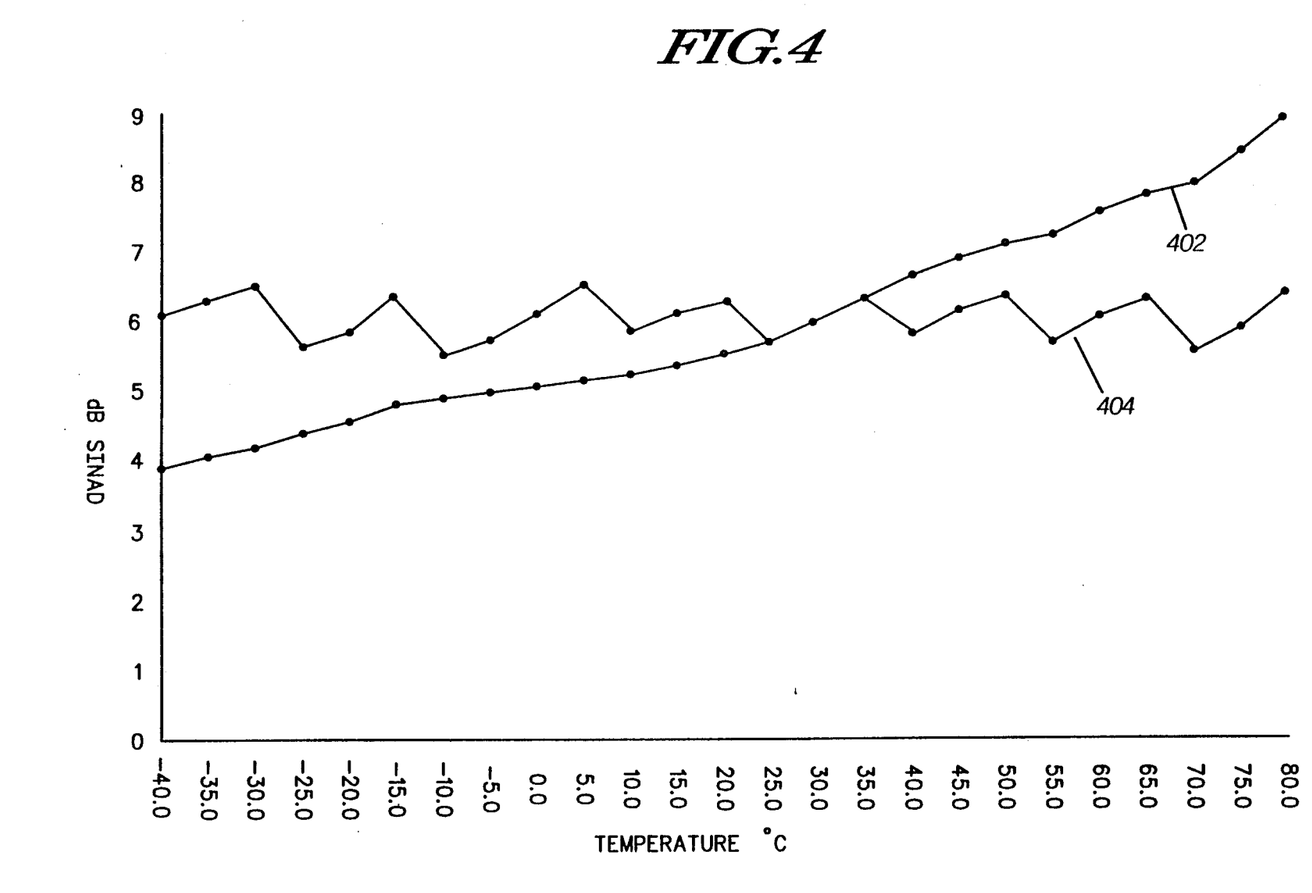
FIG. 4 is a graph plotting compensated and uncompensated squelch performance over temperature.

In FIG. 3, a graph showing the differences in noise signatures for different channel spacing for a squelch circuit a fixed 10.5 dB squelch attenuation level is shown. 302, is representative of a squelch circuit receiving a signal 12.5 KHz channel spacing, while line 304 is for a 25 spacing signal. FIG. 3, plots SINAD in dB which is the usable sensitivity against temperature. SINAD is typically defined as the lowest RF signal from the standard signal modulated with the standard tone which will produce at least of the rated audio output with 12 dB or better ratio of Noise+Distortion/Noise+Distortion. As can be seen by the graph in FIG. 3, line 302 (12.5 KHz spacing) shows a change in SINAD over temperature than the 25 KHz line In FIG. 4, a graph showing the differences in squelch performance for a squelch circuit utilizing the compensation scheme of the present invention and a circuit not utilizing a compensation scheme are shown. In FIG. 4, line 404 shows the squelch performance for a circuit utilizing the present while a noncompensated squelch circuit is shown by graph line 402. FIG. 4, was taken for a squelch circuit operating with 5 KHz channel spacing and the squelch circuits set at 10.5 dB.

The graph in FIG. 4, shows a more linear squelch performance over temperature for the compensated circuit (line 404) than for the noncompensated circuit (line 402). The more linear the squelch operation over temperature, less are the chances that squelch popping and other squelch problems will occur. Automatically compensating the squelch circuit allows a user to maintain the largest operating range for the receiver without experiencing premature squelch operation due to either temperature or changes in receive channel spacing changes.

Figure 5:
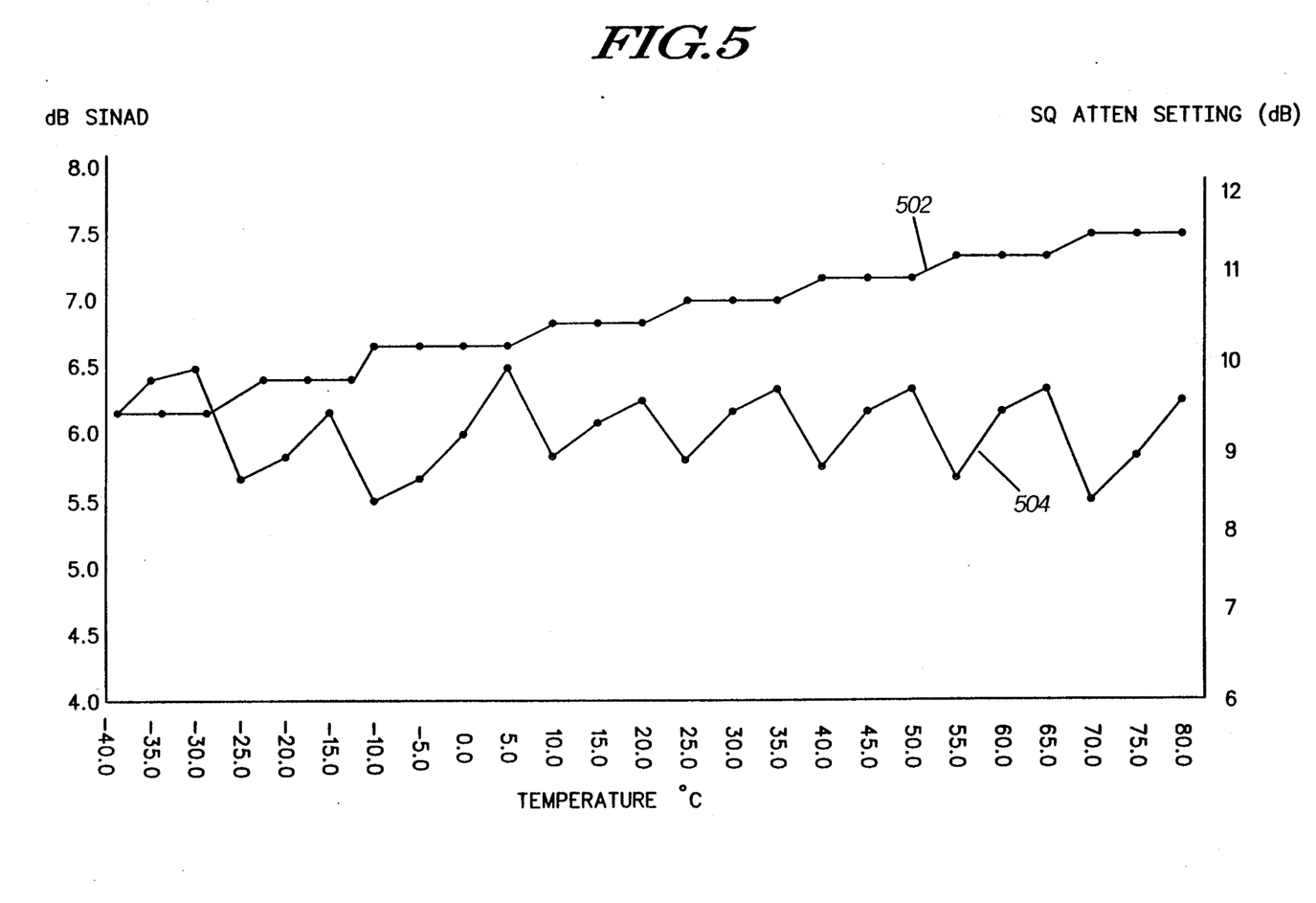
FIG. 5 is a graph plotting compensated squelch performance and squelch attenuation setting over temperature.

Referring now to FIG. 5, the graph shows compensated squelch performance for a receiver operating in a 12.5 channel spacing environment and the squelch attenuation level set at 10.5 dB (attenuation in the squelch path). Graph (same line as graph 404 of FIG. 4) plots the squelch in dB SINAD over temperature in Celsius. The top graph line 502, shows the squelch attenuation level dB (right-hand setting for the squelch setting caused by the compensation automatically adjusting the squelch circuit due to changes in temperature, etc. For example, at 25 degrees Celsius, squelch circuit's attenuation level is set at approximately (for graph line 502 the right side axis is used which is squelch attenuation setting). As the temperature of operation moves to 60 degrees Celsius, the threshold squelch setting is automatically adjusted by the circuit to dB to compensate for variations caused by the change in temperature.

The squelch circuit's attenuation level is changed by the compensated squelch word, which causes a set of digital potentiometers to be automatically adjusted in the squelch causing more or less attenuation to be added in the squelch circuit's path in order to compensate the circuit for caused by temperature or channel spacing changes. This automatic compensation of the squelch circuit in effect causes squelch circuit to have a substantially constant squelch level. In conditions when the squelch would open prematurely, the automatic compensation circuit increases the for the squelch circuit. Conditions which would cause the circuit to unsquelch at a higher threshold level would be compensated for by the compensation circuit by automatically reducing the squelch threshold.

The present invention as described above provides for the automatic compensation of a squelch circuit for either changes temperature or channel spacing, which may cause variations in performance to the squelch circuit. The present invention for a radio's squelch performance to be automatically compensated when changes in the operating conditions mentioned affect the squelch circuits performance. Two-way radios users when using the invention are no longer required tighten their receivers squelch setting (increase the level) in order to avoid annoyance caused by squelch popping. Radio operating range is at the same time not adversely since the compensated squelch setting is automatically maintained at a constant setting by automatically compensating the squelch circuit.

The invention also allows for a radios squelch characteristics to be tailored to a particular radio users conditions, and the squelch setting preferences of individual users. The invention also allows for one squelch circuit to be used in different radio products utilizing different "radio designs. The circuit could be installed in radios having ZIF backends, double conversion back-ends, etc. Thus, one manufacturing line could accommodate any number of receiver back-end designs and still adjust each different radio for squelch operation. This would provide for improved manufacturing cycle times and also provide for improved cost savings which are achieved by utilizing a single squelch For example, a matrix of squelch settings used to program the squelch of a radio incorporating a receiver using a ZIF can be modified by providing new compensation values which adjust the squelch circuit's attenuator settings, amplifier filter characteristics to accommodate for the differences in radio using a dual conversion back-end.

In summary, the present invention provides a major advantage to radios operating in changing environmental conditions. The present invention allows for automatic radio adjustment of the squelch threshold level, without the need to reprogram the radio, something that can take time and cost a considerable amount of money. Given that modern radios can operate over large frequency ranges, and can use different channel spacing (e.g., 12.5 KHz in 821-824 MHz spacing in the 850-870 MHz range), the present for adjustments to be dynamically made to the squelch circuit order to ensure proper squelch performance. Changes in the characteristic noise footprint of the squelch circuit which caused by changes in the operating system deviation levels can also be automatically compensated.

What is claimed is:

1. A receiver squelch circuit having a squelch setting, the receiver squelch circuit comprising:
   an input means for receiving a channel spacing signal;
   means for converting the channel spacing signal into an address word;
   memory means responsive to the address word for providing a compensation word; and
   compensation means for receiving the compensation word and automatically compensating the squelch setting.

2. A receiver squelch circuit as defined in claim 1, wherein the receiver squelch circuit further comprises:
   a programmable device and the compensation means compensates the squelch circuit by reprogramming the programmable device.

3. A receiver squelch circuit as defined in claim 2, wherein the programmable device is a programmable potentiometer.

4. A receiver squelch circuit as defined in claim 2, wherein the compensation means further comprises:
   a modifying means for modifying the squelch setting with the compensation word in order to yield a compensated squelch word for compensating the programmable device.

5. A radio frequency receiver squelch circuit having a squelch setting, the receiver squelch circuit comprising:
   an input means for receiving a temperature signal;
   a second input means for receiving a channel spacing signal;
   means for converting the temperature signal and channel spacing signal into an address word;
   memory means responsive to the address word for providing a compensation word; and
   compensation means for receiving the compensation word and automatically compensating the receiver squelch circuit.

6. A receiver squelch circuit as defined in claim 5, wherein the compensation means compensates the receiver squelch circuit by adjusting the squelch setting.

7. A receiver squelch circuit as defined in claim 5, wherein the receiver squelch circuit further comprises:
   a means for combining the compensation word with the squelch setting in order to yield a compensated squelch word; and
   at least one programmable device and the compensated squelch word is used to automatically compensate the at least one programmable device in order to compensate the receiver squelch circuit.

8. A radio frequency receiver for receiving radio frequency signal having at least one predetermined channel spacing, the radio frequency receiver having a squelch setting, the radio frequency receiver comprising:
   a temperature circuit for providing a temperature signal;
   a controller means for providing a channel spacing signal representative of the channel spacing being used by the receiver; and
   a squelch circuit, comprising:
      input means for receiving the temperature signal and the channel spacing signal;
      a means for changing the temperature signal and channel spacing signal into an address word;
      memory means responsive to the address word for providing a compensation word; and
      compensation means for receiving the compensation word and automatically compensating the squelch setting.

9. A radio frequency receiver as defined in claim 8, wherein the temperature signal is representative of an operating temperature of the receiver.

10. A radio frequency receiver as defined in claim 8, wherein the temperature signal is representative of an operating temperature of the squelch circuit.

11. A radio frequency receiver as defined in claim 8, wherein the squelch circuit further comprises:
    an adjustable amplifier stage, and the compensation means compensates the squelch setting by adjusting a gain of the amplifier stage.

12. A radio frequency receiver as defined in claim 8, wherein the squelch circuit further comprises:

a programmable filter stage, and the compensation means compensates the squelch setting by reprogramming the programmable filter stage.

13. A radio frequency receiver having receiver channels having predetermined channel spacings and a squelch setting, the radio frequency receiver comprising:
a temperature circuit for providing a temperature signal;
a controller means for providing a channel spacing signal representative of the channel spacing being used by the receiver, the controller also providing a default squelch word; and
a squelch circuit, comprising:
an input means for receiving the temperature signal and channel spacing signal;
a means for combining the temperature signal and channel spacing signal into an address word;
memory means responsive to the address word for providing a compensation word;
a means for combining the squelch setting with the compensation word and outputting a compensated squelch word; and
a compensation means for receiving the compensated squelch word and automatically compensating the squelch circuit.

14. A radio frequency receiver as defined in claim 13, wherein the compensation means further comprises an adjustable amplifier stage and the compensation means compensates the squelch circuit by adjusting a gain of the amplifier.

15. A method for temperature compensating a receiver squelch circuit having a default squelch setting, comprising the steps of:
determining the operating temperature of the squelch circuit;
producing an address word representative of the operating temperature;
using the address word to select a compensation word; and
modifying the default squelch setting with the compensation word to produce a compensated squelch setting.

16. A method for compensating a receiver squelch circuit as defined in claim 15, further comprising the step of:
receiving a channel spacing value and using the channel spacing value to modify the address word prior to selecting the compensation word.

17. A method compensating a receiver squelch circuit as defined in claim 16, wherein the step of modifying the default squelch setting comprises the further step of:
summing the default squelch setting with the compensation word to produce the compensated squelch setting.

* * * * *